United States Patent
James et al.

(10) Patent No.: US 7,714,287 B1
(45) Date of Patent: May 11, 2010

(54) APPARATUS AND METHOD FOR OBTAINING TOPOGRAPHICAL DARK-FIELD IMAGES IN A SCANNING ELECTRON MICROSCOPE

(75) Inventors: Edward M. James, San Francisco, CA (US); Ye Yang, Fremont, CA (US); Mark Lin, San Jose, CA (US); Alexander J. Gubbens, Redwood City, CA (US); Paul Petric, Pleasanton, CA (US)

(73) Assignee: KLA-Tencor Corporation, San Jose, CA (US)

( * ) Notice: Subject to any disclaimer, the term of this patent is extended or adjusted under 35 U.S.C. 154(b) by 100 days.

(21) Appl. No.: 12/194,153

(22) Filed: Aug. 19, 2008

Related U.S. Application Data

(60) Provisional application No. 61/059,164, filed on Jun. 5, 2008.

(51) Int. Cl.
*H01J 49/08* (2006.01)
*G01N 21/00* (2006.01)
*G01N 23/00* (2006.01)

(52) U.S. Cl. .............. 250/310; 250/306; 250/307; 250/396 R; 250/397; 250/492.2

(58) Field of Classification Search ............ 250/310, 250/306, 307, 396 R, 397, 492.2
See application file for complete search history.

(56) References Cited

U.S. PATENT DOCUMENTS

| | | |
|---|---|---|
| 5,424,541 A | 6/1995 | Todokoro et al. |
| 5,644,132 A | 7/1997 | Litman et al. |
| 6,407,373 B1 | 6/2002 | Dotan |
| 6,667,476 B2 | 12/2003 | Todokoro et al. |
| 6,872,944 B2 | 3/2005 | Todokoro et al. |
| 6,885,001 B2 | 4/2005 | Ose et al. |
| 7,141,791 B2 * | 11/2006 | Masnaghetti et al. ......... 250/311 |
| 7,247,849 B1 * | 7/2007 | Toth et al. ................... 250/307 |
| 2005/0122508 A1 * | 6/2005 | Uto et al. .................. 356/237.2 |

* cited by examiner

Primary Examiner—Nikita Wells
(74) Attorney, Agent, or Firm—Okamoto & Benedicto LLP

(57) ABSTRACT

An electron beam apparatus is configured for dark field imaging of a substrate surface. Dark field is defined as an operational mode where the image contrast is sensitive to topographical features on the surface. A source generates a primary electron beam, and scan deflectors are configured to deflect the primary electron beam so as to scan the primary electron beam over the substrate surface whereby secondary and/or backscattered electrons are emitted from the substrate surface, said emitted electrons forming a scattered electron beam. A beam separator is configured to separate the scattered electron beam from the primary electron beam. The apparatus includes a cooperative arrangement which includes at least a ring-like element, a first grid, and a second grid. The ring-like element and the first and second grids each comprises conductive material. A segmented detector assembly is positioned to receive the scattered electron beam after the scattered electron beam passes through the cooperative arrangement. Other embodiments, aspects and features are also disclosed. The apparatus is configured to yield good topographical contrast, high signal to noise ratio, and to accommodate a variety of scattered beam properties that result from different primary beam and scan geometry settings.

27 Claims, 7 Drawing Sheets

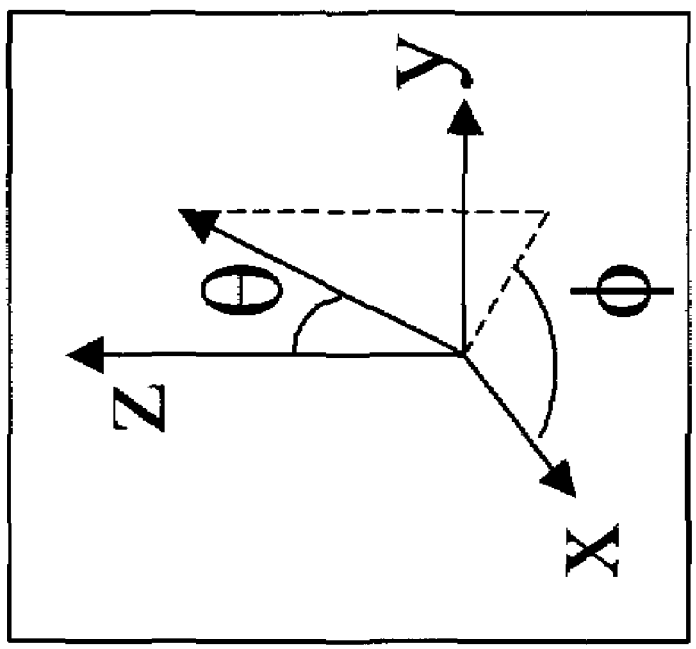
FIG. 1
(Conventional)

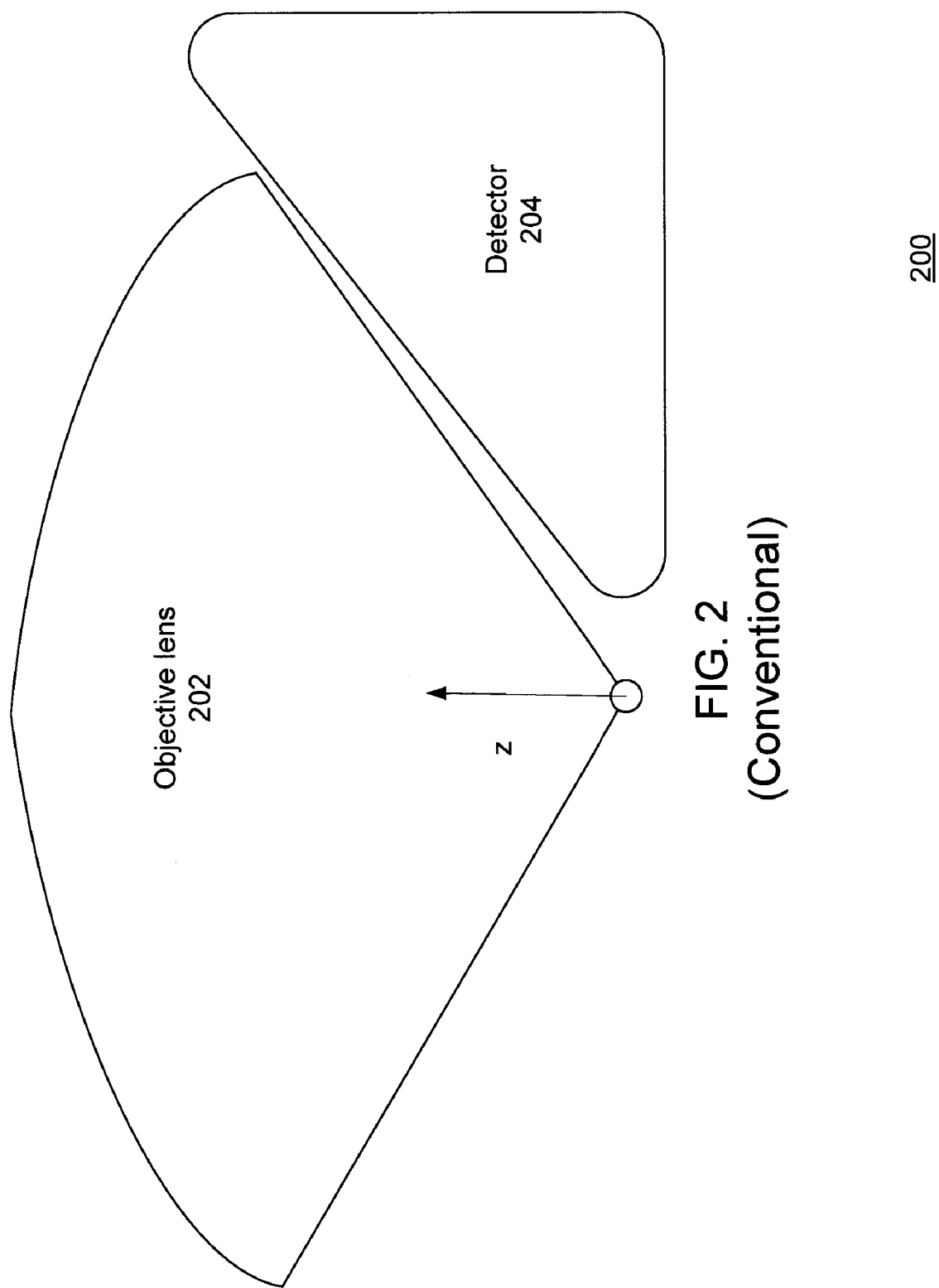
FIG. 2
(Conventional)

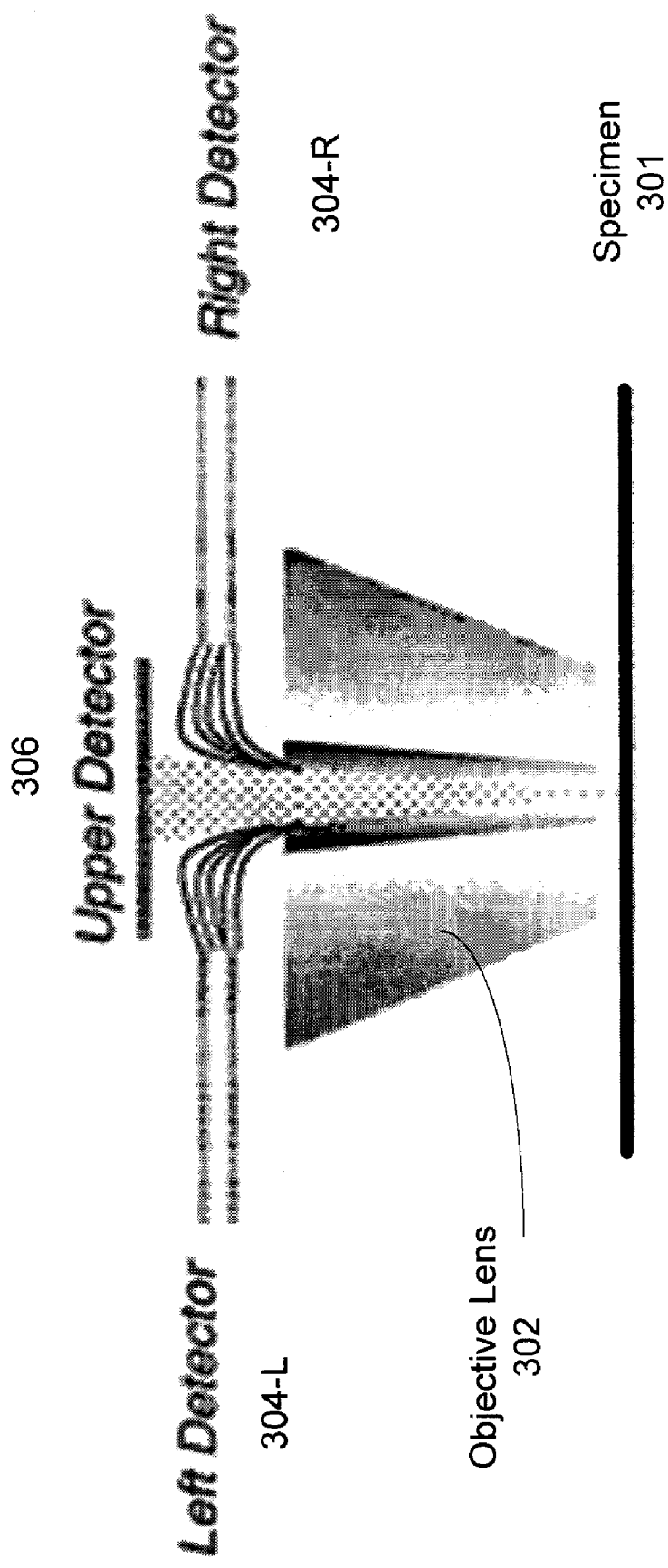
FIG. 3
(Conventional)

APPARATUS AND METHOD FOR OBTAINING TOPOGRAPHICAL DARK-FIELD IMAGES IN A SCANNING ELECTRON MICROSCOPE

CROSS-REFERENCE TO RELATED APPLICATION

The present application claims the benefit of U.S. Provisional Patent Application No. 61/059,164 entitled "Apparatus and Method for Obtaining Topographical Images in a Scanning Electron Microscope", filed Jun. 5, 2008, by inventors Edward M. James; Ye Yang; Mark Lin; Alexander J. Gubbens; and Paul Petric. The disclosure of U.S. Provisional Patent Application No. 61/059,164 is hereby incorporated by reference.

BACKGROUND OF THE INVENTION

1. Field of the Invention

The present invention relates to apparatus and methods for electron beam imaging.

2. Description of the Background Art

The two most common types of electron microscopes available commercially are the scanning electron microscope (SEM) and the transmission electron microscope (TEM). In an SEM, the specimen is scanned with a focused beam of electrons which produce secondary and/or backscattered electrons as the beam hits the specimen. These are detected and typically converted into an image of the surface of the specimen. Specimens in a TEM are examined by passing the electron beam through them, revealing more information of the internal structure of specimens.

Bright field imaging and dark field imaging are often used in the context of TEMs. A bright field image may be formed in a TEM by selecting electrons from a central diffraction spot to form the image. A dark field image may be formed in a TEM by selecting some or all of the (non-central) diffracted electrons to form the image. The selection of electrons may be implemented using an aperture into the back focal plane of the objective lens, thus blocking out most of the diffraction pattern except that which is visible through the aperture.

Dark field imaging is typically less commonly used in SEMs. In SEMs the terminology is used to describe imaging modes yielding contrast sensitive to the surface topography. "Dark field imaging" and "topographical imaging" expressions can therefore be used interchangeably. In general, dark field images are those obtained using electrons emitted from the sample surface at high polar angles and a given range of azimuthal angles. The definitions of the polar angle $\theta$ and azimuth angle $\phi$ in relation to the scattered electrons emitted from the specimen are shown by illustration in FIG. 1. In FIG. 1, the specimen plane is the x, y plane. The z-axis is normal to the specimen plane. This type of image preferentially shows the sample surface topography by highlighting protrusions and depressions in the surface via shadowing or highlighting. This is analogous to the contrast generated by imaging a surface from an angle as it is illuminated normally by light.

A conventional SEM dark field detection system has a below-the-lens configuration 200 as depicted in FIG. 2. In a below-the-lens configuration 200, so-called "external" or "side" detectors 204 are positioned below the objective lens 202 at the bottom of the electron beam column (near the specimen). Under certain conditions, secondary electrons (SE) emitted at higher polar angles (i.e. closer to the surface), which are generally more sensitive to surface topography, will preferentially reach such below-the-lens detectors 204. Images formed with such detectors show the topography of the surface with an azimuthal perspective defined by the detector positioning with respect to the primary beam optic axis and the sample/wafer plane.

Unfortunately, the below-the-lens configuration is incompatible with final (objective) lens arrangements that immerse the specimen in magnetic and/or electric fields. These fields are needed for minimizing lens aberrations and obtaining the best resolution images, but they interfere with the collection efficiency of below-the-lens detectors 204.

In addition, the polar angle discrimination threshold is not well controlled for such below-the-lens detectors 204 because the electron energy and emission azimuth can affect the polar angle acceptance of the detector 204.

Dark field imaging may also be performed by tilting the sample/wafer plane normal vector away from the primary beam optic axis. Such tilting may be accomplished by tilting the wafer or column and has the effect of changing the angle of incidence of the primary beam. The secondary electron signal detected, either by a side channel detector or a conventional in-lens detector, shows topological DF contrast according to how the primary beam angle interacts with the surface features on the sample/wafer.

Various previous behind-the-lens configurations for an SEM dark field detection system have been employed that are compatible with final lenses with immersion electromagnetic fields at the specimen. These previous configurations distinguish between the different angular components of the secondary-electron emission after it has been captured by the electro-magnetic field and traveled up into the column beyond the final lens.

A typical behind-the-lens configuration 300 for an SEM dark field detection system is depicted in FIG. 3. A typical behind-the-lens configuration 300 uses off-axis detectors 304 similar to those shown in FIG. 3. These may be separated (as shown) or joined together to form a segmented detector. These detectors 304 are located "behind" the objective lens 302. In other words, the detectors 304 are located on the opposite side of the objective lens 302 to the specimen. Various detector geometries and associated electron optics have been used previously to detect scattered electrons with polar angle discrimination. However, behind-the-lens configurations have generally shown inferior dark-field (topographical) contrast compared to below-the-lens implementations.

SUMMARY

One embodiment relates to an electron beam apparatus configured for dark field imaging of a substrate surface. A source generates a primary electron beam, and scan deflectors are configured to deflect the primary electron beam so as to scan the primary electron beam over the substrate surface whereby secondary and/or backscattered electrons are emitted from the substrate surface, said emitted electrons forming a scattered electron beam. A beam separator is configured to separate the scattered electron beam from the primary electron beam. The apparatus includes a cooperative arrangement which includes at least a ring-like element, a first grid, and a second grid. The ring-like element and the first and second grids each comprise conductive material. A segmented detector is positioned to receive the scattered electron beam after the scattered electron beam passes through the cooperative arrangement.

Another embodiment relates to a method for dark field imaging of a substrate surface. Other embodiments, aspects and features are also disclosed.

BRIEF DESCRIPTION OF THE DRAWINGS

FIG. 1 is a diagram depicting a conventional definition of angles.

FIG. 2 is a three-dimensional depiction of an SEM dark field detection system with a previous below-the-lens configuration.

FIG. 3 is a schematic diagram of a generic SEM dark field detection system with a behind-the-lens configuration.

DETAILED DESCRIPTION

The present application discloses a behind-the-lens-darkfield (BLDF) configuration which is designed to act as a detector in a scanning electron microscope (SEM). The BLDF configuration has multiple detection elements that are designed to efficiently collect signals for the generation of images giving multiple perspectives of a surface of a sample substrate. The multiple perspectives include so-called darkfield (DF) and bright-field (BF) perspectives.

DF images typically highlight wafer topography. DF images primarily use the signal from secondary electrons (SE) and/or backscattered electrons (BSE) emitted from the sample with higher polar angles (i.e. with trajectories closer to the surface). BF images (which are more conventional than DF images) typically highlight material contrast and provide higher-resolution, planar images of the sample surface. BF images primarily use SE and/or BSE that are emitted from the sample with lower polar angles (i.e. with trajectories closer to the normal vector for the surface).

Applicants believe that embodiments of the present invention improve upon previous BLDF configurations. In particular, improved performance is provided in dark field purity, flexibility, image uniformity, and/or signal-to-noise ratio (SNR).

Regarding dark field purity, it is desirable to have the capability to better separate signals of secondary electrons emitted at higher polar angles from secondary electrons emitted at lower polar angles. It is further desirable to have an improved capability to discriminate signals corresponding to secondary electrons emitted at different azimuthal angles.

Regarding flexibility, it is desirable to have the aforementioned improved signal separation over a wide range of primary beam conditions. Such primary beam conditions may then be optimized or adjusted to reduce deleterious effects, such as sample charging, while maintaining adequate darkfield purity.

Regarding image uniformity, it is desirable to produce images with relatively uniform contrast, brightness and DF content across the field of view. This improves image aesthetics and also improves the reliable performance of image processing algorithms such as automatic defect review (ADR) procedures.

Regarding the signal-to-noise ratio (SNR), it is desirable to produce images with improved SNR in comparison to previous detector configurations.

Figure 4A:
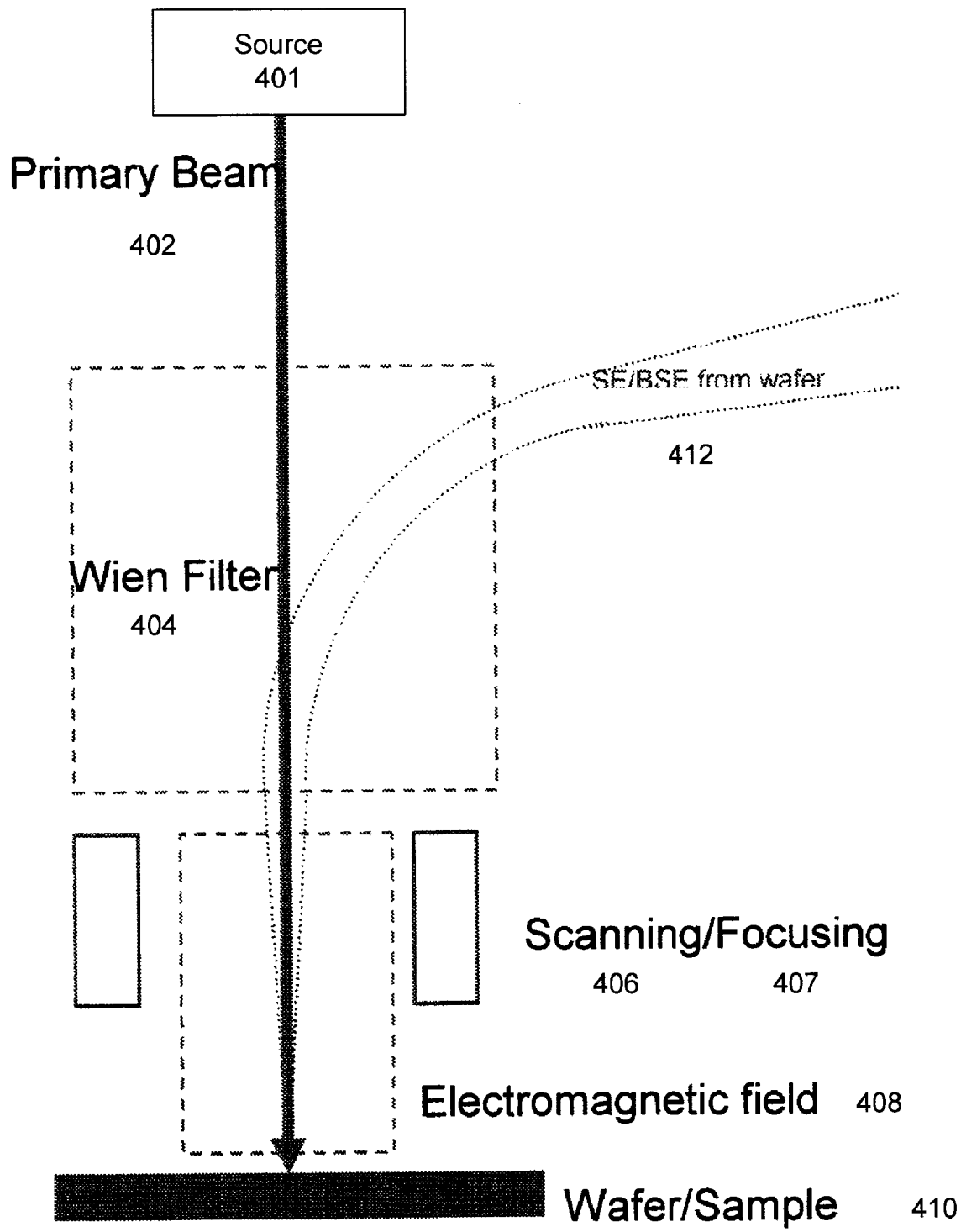
FIG. 4A is a schematic diagram of an electron beam column for an apparatus in accordance with an embodiment of the invention.

FIG. 4A is a schematic diagram of an electron beam column for an apparatus in accordance with an embodiment of the invention. As seen, source 401 generates a primary beam 402 of electrons. The primary beam 402 passes through a Wien filter 404 which is configured to separate the primary beam 402 from the secondary electron (SE) and/or backscattered electron (BSE) beam 412.

Scanning deflectors 406 and focusing electron lenses 407 are utilized. The scanning deflectors 406 are utilized to scan the electron beam across the surface of the wafer or other substrate sample 410. The focusing electron lenses 407 are utilized to focus the electron beam into a beam spot on the surface of the wafer or other substrate sample 410. In accordance with one embodiment, the focusing lenses 407 may include an immersion lens which is configured with a variable extraction field to control the acceleration of emitted electrons away form the sample and control the level of polar angle discrimination.

Secondary electrons and/or backscattered electrons are scattered or extracted from the wafer/sample 410. These secondary and/or backscattered electrons are exposed to the action of the final (objective) lens by way of the electromagnetic field 408. The electromagnetic field 408 acts to confine the secondary and/or backscattered electrons to within a relatively small distance from the primary beam optic axis and to accelerate these electrons up into the column. In this way, a scattered electron beam 412 is formed from the secondary and/or backscattered electrons.

The Wien filter 404 is an optical element configured to generate electrical and magnetic fields which cross each other. The Wien filter 404 deflects the scattered electron beam 412 from the optic axis of the primary beam to a detection axis. This serves to separate the scattered electron beam 412 from the primary beam 402.

For example, in one implementation, the electron source 401 may be at negative five kilovolts (−5 kV), and the stage for the wafer/sample 410 may be at negative four kilovolts (−4 kV), while the bulk of the column is at electrical ground. This is a convenient way to achieve a primary beam landing energy of 1 keV, which is representative for low-landing-energy SEM imaging applications. In such an implementation, a grounded grid (see 414 in FIG. 5B) may be used at the entrance of the detector, and a scintillator (see 422 in FIG. 5B) in the detector may be held, for example, at positive five kilovolts (+5 kV).

Figure 4B:
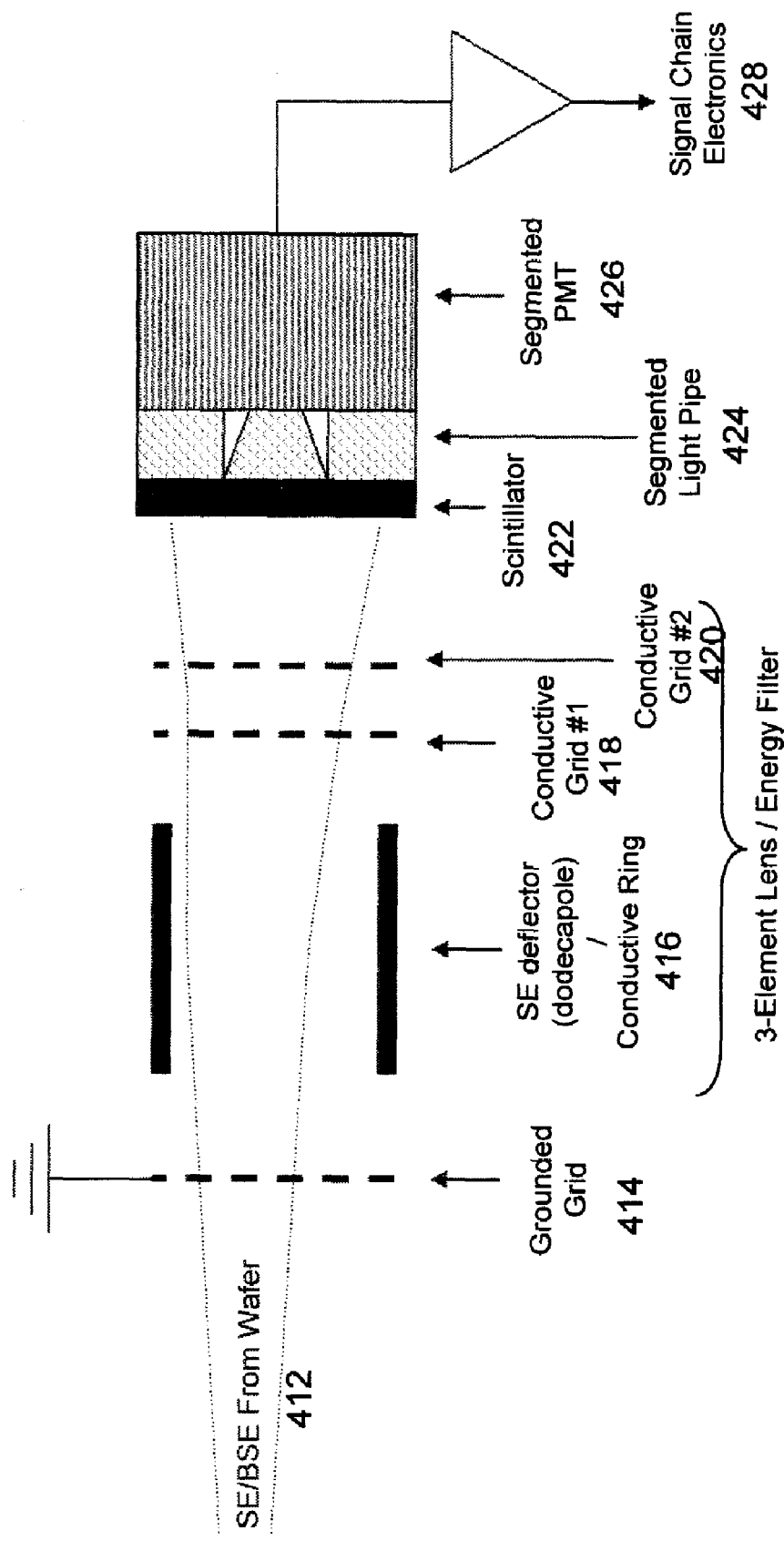
FIG. 4B is a schematic diagram of a detection system for an apparatus in accordance with an embodiment of the invention.

FIG. 4B is a schematic diagram of a detection system for an apparatus in accordance with an embodiment of the invention. As discussed above, the Wien filter 404 deflects the scattered electron beam 412 onto the optic axis for the detection system (the detection axis).

The scattered electron beam 412 may pass through one (or more) grounded conductive mesh(es) or grid(s) 414. The electrically grounded grid(s) 414 function to screen or shield a main portion of the scattered beam 412 from the effects of any fields in the main column, and to shield a main portion of the primary beam from the effects of any fields in the detection system (see FIG. 4A). In other words, the grounded grid(s) 414 serves to prevent any undesirable stray field interference between the main column and detection system 412-430.

In accordance with an embodiment of the invention, the scattered beam 412 passes through an additional electron deflector 416 which is a dodecapole (12-pole) deflector. The configuration of the dodecapole deflector is described further below in relation to FIG. 5. The electron deflector 416 may be preferably configured to minimize any undesirable movement of the scattered beam 412 which is caused by the scanning deflectors 406 in the main column (see FIG. 5A). It may also be configured to align the scattered beam accurately to the final detection element (the scintillator 422).

The scattered beam 412 may then pass through a pair of biased conductive grids 418 and 420 with appropriate voltages applied thereto.

When combined with a conductive ring-like structure 416, the grids 418 and 420 may be configured to form an electrostatic lens in a first operating mode or to act as an energy filter in a second operating mode. The preferred cooperative arrangement includes the ring-like conductive element and the two biased grids with close separations (on the order of millimeters, or less than one centimeter) therebetween. The middle element of the three elements (the two biased grids and the conductive ring) may be defined as the electron lens grid 418. In one embodiment, the conductive ring-like structure may comprise a dodecapole deflector when it is used as the electron deflector 416 and positioned sufficiently close to the electron lens grid 418, as shown in FIG. 4B. To operate as the ring-like conductive element of the combination, the dodecapole plate voltages should be kept at substantially lower voltages than the electron lens grid 418.

In the first operating mode, the voltage applied to the electron lens grid 418 may be varied to focus (converge) or defocus (diverge) the scattered electron beam 412. By such operation, the diameter of the scattered beam 412 may be adjusted at subsequent planes within the detection system, such as the plane at the surface of a scintillator in the detection system. This allows for the compensation of diameter changes for the scattered beam 412 that may take place as a side effect of when the primary beam 402 is adjusted to best image a particular sample 410.

Typically, the ring-like conductive element (for example, the dodecapole) and the second biased grid 420 are kept relatively close to ground, but this is not mandatory as a lens will be formed as long as there are substantial voltage differences between the grids and the ring-like element. In one example, to form a diverging electrostatic lens, the electron lens grid (mesh) 418 may be at negative three kilovolts ($-3$ kV), while the dodecapole deflector 416 (or other ring-like element) and the second biased grid 420 are near or at electrical ground. Such a configuration operates to diverge (defocus or spread out) the scattered electron beam 412, as depicted in FIG. 4B. In another example, to form a converging electrostatic lens, the electron lens grid 418 may be at positive three kilovolts ($+3$ kV), while the dodecapole deflector 416 (or other ring-like element) and the second biased grid 420 are near or at electrical ground. Such a configuration operates to converge (focus) the scattered electron beam 412.

Advantageously, the above-described three-element lens is very compact and may be used to either diverge or converge the scattered electron beam 412 within the detection system.

In the second operating mode, the three-element arrangement may be configured to function as an energy filter. A negative voltage on either of the two biased grids may be used to slow the electrons of the scattered electron beam. At a certain voltage level, the slower electrons are repelled and do not pass to the detection elements further down in the detection system. Note that either of the two biased grids (418 or 420) may be used as the active element. Different filter characteristics may be achieved in this way. In one example, the ring-like element and the first biased grid 418 may be held at or near electrical ground while a negative voltage (for example, minus four kilovolts) may be applied to the second biased grid 420 (such that the second biased grid is the active grid). In another example, the ring-like element and the second biased grid 420 may be held at or near electrical ground while a negative voltage (for example, minus four kilovolts or $-4$ kV) may be applied to the first biased grid 418 (such that the first biased grid is the active grid). In an alternative arrangement, the scattered beam 412 may encounter the two biased grids first and then the conductive ring-like element.

Advantageously, by filtering out the lowest energy scattered electrons, the signal passing to the detective elements is typically less sensitive to charging and/or contamination on the sample. An example of an arrangement of detective elements comprises the detective element stack shown in FIG. 4B.

The detective element stack shown in FIG. 4B includes a scintillator 422, a segmented light pipe 424, and a segmented photomultiplier tube (PMT) 426. Advantageously, the detective stack disclosed herein provides for an efficient signal path with improved detective quantum efficiency (DQE). Higher DQE yields an improved signal-to-noise ratio (SNR) for a given scattered electron beam 412 signal from the sample/wafer.

The scintillator 422 may comprise, for example, an aluminum-coated Yttrium Aluminum Garnet (YAG) substrate. The aluminum coating is a thin conductive coating so it may be set to a high electrical potential without substantially charging. Alternatively, a coated Yttrium Aluminum Perovskite (YAP) crystal may be used for the scintillator 422. Use of these scintillator types provides a robust, high-gain first element to the signal acquisition process.

In accordance with one embodiment, the scintillator 422 may be configured as a single piece and the detector segmentation may be achieved using a segmented light pipe 424, for example. The segmented light pipe 424 may be configured to effectively segment the scintillator into five or more channels. For instance, the segmentation may be accomplished using a white, optically opaque epoxy, which holds the segments in place while preventing optical cross-talk between them.

In accordance with another embodiment, the scintillator 422 itself may be divided into two or more segments. This advantageously reduces cross talk between the channels of the instrument, thereby maintaining integrity of the signal as a function of detected position. It may also be configured to reduce optical signal loss through the edges of the scintillator. For example, in the case where the scintillator 422 is divided into two segments, a center segment may be separated from an outer segment using an opaque epoxy. Other implementations may replace the epoxy separation with a solid wall separation. The solid wall separation may extend throughout the detective element stack to keep the channels well separated.

Figure 6:
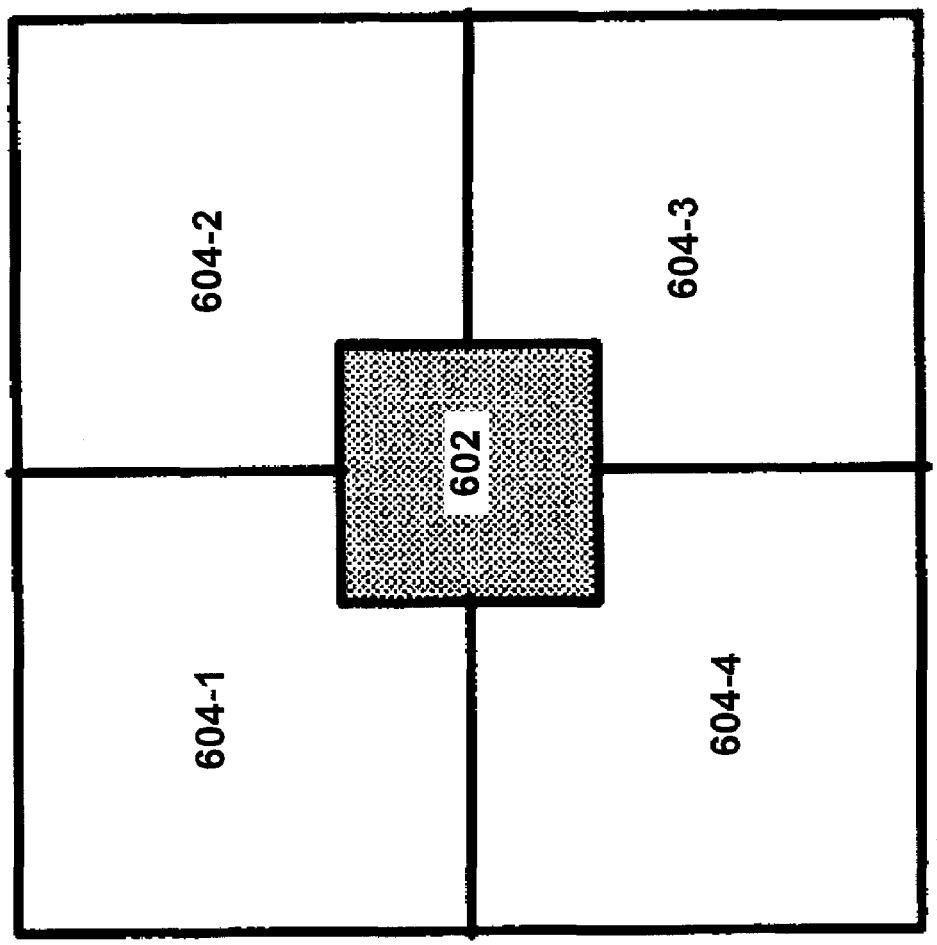
FIG. 6 is a schematic diagram of a detector segmentation in accordance with an embodiment of the invention.

An embodiment of the invention may utilize a segmented optical coupling (segmented light pipe) 424. Use of such a segmented optical coupling 424 is optional in that other embodiments may not include one. For example, the segmented optical coupling 424 may comprise a thin optical plate, which may be made of a high refractive index material such as sapphire, bonded to the scintillator 422 using a clear, transmissive epoxy, or, alternatively, clamped to the scintillator with optical grease optionally applied between the elements. The plate may be segmented to reflect the desired channel geometry. One example of such segmentation is shown in FIG. 6. The individual segments of the optical coupling 424 may be, for example, glued together using a white, optically opaque epoxy. Advantageously, the high refractive index and small thickness of a sapphire plate provides for more efficient optical coupling and a compact arrangement, while also resisting electrical breakdown when a high voltage applied to the scintillator's conductive surface 422. In addition, this design results in reduced optical cross talk. This enables the detector to operate with increased detective quantum efficiency (DQE).

Alternative embodiments may utilize different optical materials or coupling glues (which may be selected based on the scintillator chosen and its refractive index). The optical plate segments may also be separated with a solid wall of insulating material. Such a wall may extend throughout the whole detective element stack to keep channels separated. The wall may also be made reflective via use of an insulating multilayer coating.

Another embodiment may utilize the scintillator itself as the optical coupling medium. In this case, the scintillator may be made substantially thicker in order to hold off (provide a layer insulating against) the high voltage between its conductive coating and the rest of the device.

A segmented photomultiplier tube (PMT) 426 may be bonded to the back of the optical coupling plate 424. For example, a multi-anode PMT may be configured with a photocathode entrance window and a dynode array behind the cathode. The array of dynodes (for example, an 8×8 array of dynodes) may be utilized to effectively segment the PMT. The outputs of the multiple dynodes may be electrically tied together to form groupings that correspond to the desired spatial segmentation of the detector. In accordance with one implementation, light entering the multi-anode PMT 426 is preferentially directed down a signal chain into one of five channels, the five channels corresponding to a center detector segment and four outer segments, as depicted in FIG. 6. In one implementation, the multi-anode PMT 426 may be bonded to the back of a sapphire optical coupling plate using clear epoxy. Alternatively, clamping may be used, with or without optical coupling grease. Mounting of the multi-anode PMT 426 in vacuum directly to the back of the scintillator/optical plate stack is very optically efficient, allows less opportunity for inter-segment cross talk or noise pick-up, and is very compact. Alternatively, the segmented PMT 426 may have a segmented photocathode entrance window, or may consist of miniature individual PMTs bonded to the back of the optical coupling plate 424 in an array, or other desired arrangement.

Finally, a multi-purpose circuit board (including pre-amplifier circuitry 428) may be mounted on top of the PMT 426 and within the vacuum environment. The circuit board may provide high voltage to operate the PMT 426 and may also have a voltage divider to split the voltage correctly across the dynode array. The circuit board may also be configured to group the output signals from the many (for example, sixty-four) dynodes of the multi-anode PMT 426 into several (for example, five) signal paths or chains For example, in the implementation with five signal paths, the five signal paths may correspond to a center detector segment and four surrounding outer segments. The power and signal connections may be fed to vacuum feedthroughs and onto other electronics components outside of the vacuum.

Figure 5:
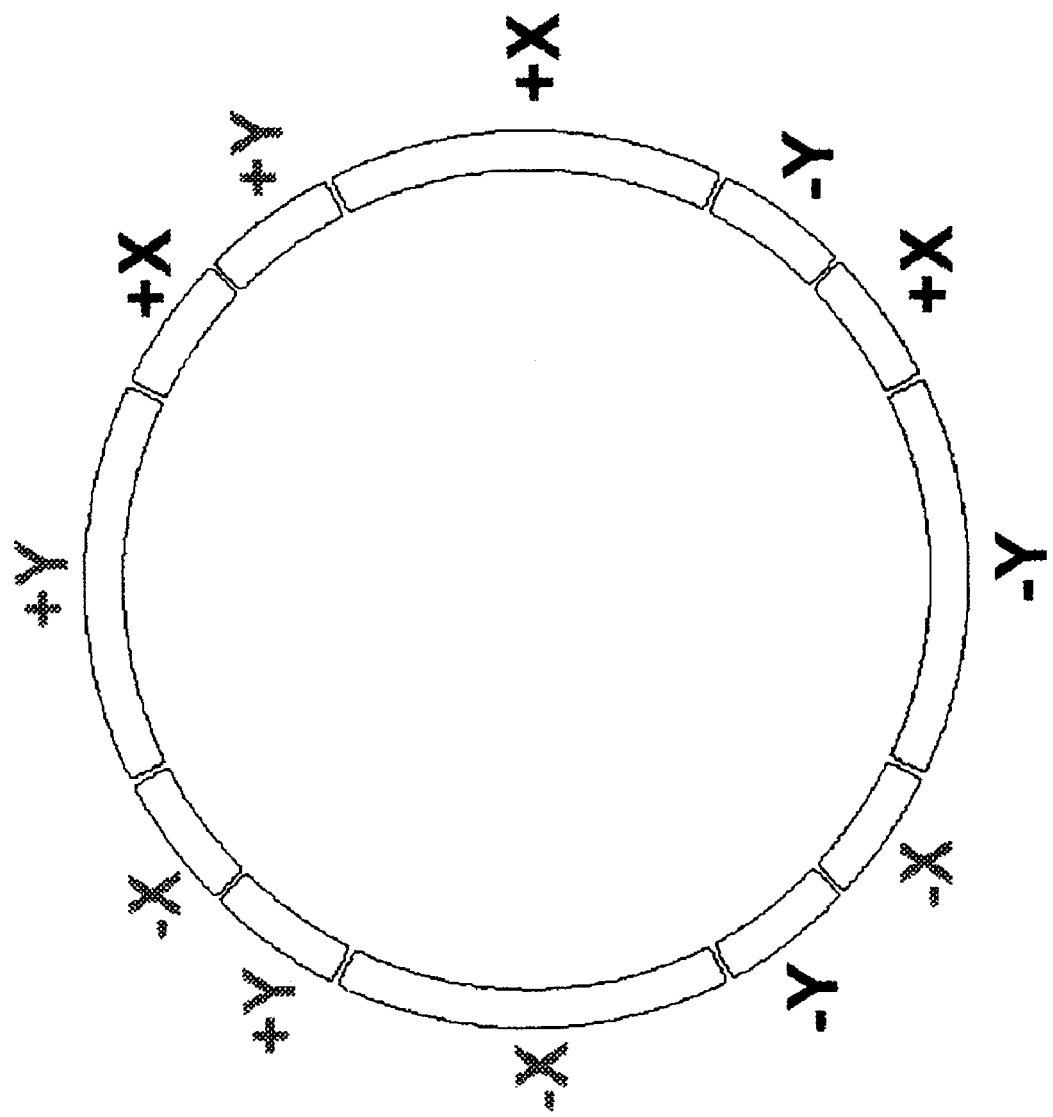
FIG. 5 is a schematic diagram of a dodecapole deflector in accordance with an embodiment of the invention.

FIG. 5 is a schematic diagram of a dodecapole deflector in accordance with an embodiment of the invention. As discussed above, the electron deflector 416 in the detection apparatus may comprise such a dodecapole deflector. As seen, the dodecapole deflector comprises twelve conductive plates. The geometry (relative dimensions) of the plates is designed such that the dodecapole mimics two dipole elements when four appropriate voltages are applied.

Voltages may be applied to the twelve plates as shown in FIG. 5 to generate a first dipole (x-dipole) in the "x" direction and a second dipole (y-dipole) in the "y" direction, wherein the x and y directions are perpendicular to each other. The strength and direction of the x-dipole would depend on the voltage X and the geometry of the plates, while the strength and direction of the y-dipole would depend on the voltage Y and the geometry of the plates. As seen, the three plates labeled "+X" would have +X volts applied to them, and the three plates labeled "−X" would have −X volts applied to them. These six plates would effectively generate the x-dipole (in the horizontal direction in FIG. 5). Meanwhile, the three plates labeled "+Y" would have +Y volts applied to them, and the three plates labeled "−Y" would have −Y volts applied to them. These six plates would effectively generate the y-dipole (in the vertical direction in FIG. 5).

In particular, a DC-type (direct or steady) deflection may be used to align the scattered beam 412 correctly with the subsequent detector elements, and an AC-type (alternating) deflection may be applied to compensate for undesirable scanned movement of the scattered beam 412 entering the detection system. This combination of fields may be used to improve the image symmetry and uniformity in a way that does not adversely affect the primary beam 402.

Advantageously, the use of the 12 deflection plates allows for a good approximation to perfect X and Y dipoles to be produced in a very compact deflector. Although electrostatic deflection is being used in the "dodecapole" deflector shown in FIG. 5, an alternative embodiment may employ magnetic deflection using pairs of saddle coils or similar means. Other alternative arrangements may use more than twelve plates to form the deflector. For example, an icosopole (20-plate) deflector may be used.

FIG. 6 is a diagram of a detector segmentation in accordance with an embodiment of the invention. As shown in FIG. 6, one or more elements of the detective stack may be segmented into five channels. The five channels including a center channel 602 and four outer channels 604-1, 604-2, 604-3, and 604-4. For example, the optical coupling (light pipe) 424 may be segmented as shown in FIG. 6. In addition, the dynodes of the segmented PMT 426 may be grouped to effectively form this segmentation. In alternative embodiments, different segmentations may be implemented.

Advantageously, the above-disclosed apparatus improves topographical imaging for a behind-the-lens-dark-field (BLDF) geometry in the following ways.

Regarding dark field purity, the segmentation implementation in the BLDF detective elements will reduce cross-talk between the detector segments that sample secondary and/or backscattered electrons that were emitted at differing polar and azimuthal angles. This results in improved topographical contrast. The enhanced detector DQE enables weaker topographical contrast to be visible at viable SNR levels. The above-described three-element grid and ring arrangement operating in a lens mode enables the scattered beam to be focused or diverged to an optimal size at the scintillator plate, ensuring that the higher-polar-angle secondary electron emission is directed towards the outer detector segments. Finally, the use of the three-element arrangement in an energy filter mode provides for the lower-energy secondary electrons to be filtered out of the image. Filtering the lower-energy secondary electrons can advantageously reduce mixing between electrons and minimize non-topographical image contrast.

Regarding flexibility, the three-element arrangement in the lens mode may be used to advantageously compensate for the effect on the scattered beam caused by using a variety of conditions for the primary beam set-up and focusing. In addition, the enhanced detector DQE enables weaker signals to be imaged at adequate SNR, thereby allowing use of lower beam current or higher imaging throughput (by way of less image acquisition time or less frame averaging).

Regarding image uniformity, the optional dodecapole deflection element may be used to correct for image nonuniformity due to, for example, the undesirable effects of the scattered beam caused by scanning of the primary beam, or a sub-optimal location of the detector plane. For large fields of view (FOV), this may advantageously reduce spurious gray level variation towards the edges of the FOV. The three-element arrangement in the filter mode may be advantageously used to filter out lower energy secondary electrons which are more susceptible to having their trajectories disturbed by charging of the substrate surface. This can reduce charging-related image artifacts. Furthermore, the improved flexibility to use an extended range of primary beam landing energies, extraction fields and/or beam currents increases the capability to find SEM set-ups that minimize sample/wafer charging and the image artifacts the charging produces.

Finally, regarding the SNR, the enhanced DQE enables the imaging of weaker signals at adequate SNR.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An electron beam apparatus configured for dark field (topographical) imaging of a substrate surface, the apparatus comprising:
    a source for generating a primary electron beam;
    scan deflectors configured to deflect the primary electron beam so as to scan the primary electron beam over the substrate surface causing electrons to be emitted from the substrate surface, said emitted electrons forming a scattered electron beam;
    a beam separator configured to separate the scattered electron beam from the primary electron beam;
    a cooperative arrangement including at least a ring-like element, a first grid, and a second grid, the ring-like element and the first and second grids each comprising conductive material; and
    a segmented detector positioned to receive the scattered electron beam after the scattered electron beam passes through the cooperative arrangement.

2. The apparatus of claim 1, wherein the scattered electron beam first encounters the ring-like element, then the first grid, then the second grid.

3. The apparatus of claim 2, wherein the cooperative arrangement is operated in a defocusing mode by applying a negative voltage to the first grid relative to the ring-like element and the second grid so as to defocus the scattered electron beam passing through the cooperative arrangement.

4. The apparatus of claim 2, wherein the cooperative arrangement is operated in a focusing mode by applying a positive voltage to the first grid relative to the ring-like element and the second grid so as to focus the scattered electron beam passing through the cooperative arrangement.

5. The arrangement of claim 2, wherein the cooperative arrangement is operated in an energy filter mode by applying a negative voltage to at least one of said grids relative to the ring-like element so as to filter out lower-energy electrons from the scattered electron beam.

6. The apparatus of claim 1, wherein the ring-like element comprises an electron deflector.

7. The apparatus of claim 6, wherein the electron deflector includes at least twelve conductive plates.

8. The apparatus of claim 6, wherein the electron deflector includes a first group of at least three conductive plates have a first voltage applied thereto and a second group of at least three conductive plates have a second voltage applied thereto to achieve deflection along a first axis, further wherein the first and second voltages are opposite to each other.

9. The apparatus of claim 8, wherein the electron deflector further includes a third group of at least three conductive plates have a third voltage applied thereto and a fourth group of at least three conductive plates have a fourth voltage applied thereto to achieve deflection along a second axis, further wherein the third and fourth voltages are opposite to each other, and further wherein the first and second axes are perpendicular to each other.

10. The apparatus of claim 1, wherein the segmented detector includes a scintillator, a segmented optical coupling, and a segmented photomultiplier tube.

11. The apparatus of claim 10, wherein the segmented optical coupling is segmented using an opaque material into a center segment and outer segments.

12. The apparatus of claim 10, wherein the scintillator is segmented using an opaque material into a center segment and outer segments.

13. The apparatus of claim 10, wherein the segmented photomultiplier tube is held in a vacuum environment.

14. The apparatus of claim 13, wherein the segmented photomultiplier tube is a single multi-anode unit with an array of dynodes.

15. The apparatus of claim 13, wherein the segmented photomultiplier tube is an array of separate photomultiplier tubes.

16. The apparatus of claim 14, wherein the multi-anode photomultiplier tube has its anodes combined electrically at output circuitry to yield some specific segmentation into sets of dynodes.

17. A method for dark field imaging of a substrate surface, the method comprising:
    generating a primary electron beam;
    deflecting the primary electron beam so as to scan the primary electron beam over the substrate surface whereby secondary and/or backscattered electrons are emitted from the substrate surface, said emitted electrons forming a scattered electron beam;
    separating the scattered electron beam from the primary electron beam;
    passing the scattered electron beam through a cooperative arrangement including at least a ring-like element, a first grid, and a second grid, the ring-like element and the first and second grids each comprising conductive material; and
    detecting the scattered electron beam by a segmented detector after the scattered electron beam passes through the cooperative arrangement.

18. The method of claim 17, wherein the scattered electron beam first encounters the ring-like element, then the first grid, then the second grid.

19. The method of claim 18, wherein the cooperative arrangement is operated in a defocusing mode by applying a negative voltage to the first grid relative to the ring-like element and the second grid so as to defocus the scattered electron beam passing through the cooperative arrangement.

20. The method of claim 18, wherein the cooperative arrangement is operated in a focusing mode by applying a positive voltage to the first grid relative to the ring-like element and the second grid so as to focus the scattered electron beam passing through the cooperative arrangement.

21. The method of claim 18, wherein the cooperative arrangement is operated in an energy filter mode by applying a negative voltage to at least one of said grids relative to the ring-like element so as to filter out lower-energy electrons from the scattered electron beam.

22. The method of claim 18, wherein the ring-like element comprises an electron deflector.

23. The method of claim 22, wherein the electron deflector includes at least twelve conductive plates.

24. The method of claim 22, wherein the electron deflector includes a first group of at least three conductive plates have a first voltage applied thereto and a second group of at least three conductive plates have a second voltage applied thereto to achieve deflection along a first axis, further wherein the first and second voltages are opposite to each other.

25. The method of claim 24, wherein the electron deflector further includes a third group of at least three conductive plates have a third voltage applied thereto and a fourth group of at least three conductive plates have a fourth voltage applied thereto to achieve deflection along a second axis, further wherein the third and fourth voltages are opposite to each other, and further wherein the first and second axes are perpendicular to each other.

26. The method of claim 17, wherein the segmented detector includes a segmented scintillator, a segmented optical coupling, and a segmented photomultiplier tube, the segmented scintillator and optical coupling is segmented using an opaque material into a center segment and outer segments, and the segmented photomultiplier tube is held in a vacuum environment.

27. An automated inspection apparatus for dark field (topographical) imaging of a substrate surface, the apparatus comprising:

means for generating a primary electron beam;

means for deflecting the primary electron beam so as to scan the primary electron beam over the substrate surface whereby secondary and/or backscattered electrons are emitted from the substrate surface, said emitted electrons forming a scattered electron beam;

means for separating the scattered electron beam from the primary electron beam;

means for passing the scattered electron beam through a cooperative arrangement including at least a ring-like element, a first grid, and a second grid, the ring-like element and the first and second grids each comprising conductive material; and means for detecting the scattered electron beam by a segmented detector after the scattered electron beam passes through the cooperative arrangement.

* * * * *